United States Patent [19]
Crescenzi, Jr. et al.

[11] Patent Number: 5,414,313
[45] Date of Patent: May 9, 1995

[54] DUAL-MODE LOGARITHMIC AMPLIFIER HAVING CASCADED STAGES

[75] Inventors: Emil J. Crescenzi, Jr., Cupertino; Jonathan K. Bamford, San Francisco; Titus J. Wandinger, Sunnyvale; Michael A. O'Mahoney, Fremont, all of Calif.

[73] Assignee: Watkins Johnson Company, Palo Alto, Calif.

[21] Appl. No.: 16,073

[22] Filed: Feb. 10, 1993

[51] Int. Cl.6 .............................................. G06G 7/24
[52] U.S. Cl. .................................................. 327/351
[58] Field of Search .................. 307/490, 492, 498; 328/145

[56] References Cited

U.S. PATENT DOCUMENTS

| | | | |
|---|---|---|---|
| 2,515,187 | 7/1950 | Bliss | 250/20 |
| 2,729,743 | 1/1956 | Le Grand | 250/27 |
| 3,403,347 | 9/1968 | Stull, Jr. | 328/145 |
| 3,423,682 | 1/1969 | Cauchois | 325/324 |
| 3,435,353 | 3/1969 | Sauber | 328/145 |
| 3,517,216 | 6/1970 | Cope | 307/237 |
| 3,584,232 | 6/1971 | Wallace, Jr. | 307/229 |
| 3,605,027 | 9/1971 | Nichols et al. | 328/145 |
| 3,668,535 | 6/1972 | Lansdowne | 329/192 |
| 3,678,294 | 7/1972 | Glathe | 307/230 |
| 3,745,474 | 7/1973 | Hughes | 328/145 |
| 3,757,136 | 9/1973 | Hughes | 307/229 |
| 3,921,008 | 11/1975 | Claverie | 307/230 |
| 4,604,532 | 8/1986 | Gilbert | 307/490 |
| 4,716,316 | 12/1987 | Colin | 307/492 |
| 4,980,584 | 12/1990 | Goff et al. | 307/492 |
| 4,990,803 | 2/1991 | Gilbert | 307/492 |

FOREIGN PATENT DOCUMENTS 3165109 7/1991 Japan ............................. 307/492

OTHER PUBLICATIONS

Comlinear Corporation, Wideband, High-Slew rate Monolighic Op Amp Aug. 1990 pp. (2-67)-(2-70).
"Wide-band Limiting Amplifiers With Low Second Harmonic Distortion, Utilizing GaAs MMIC Limiters"; E. J. Crescenzi Jr. et al.; 1985 IEEE MTT-S Digest; 0149-645X/85/0000-0328; pp. 328-331.

*Primary Examiner*—William L. Sikes
*Assistant Examiner*—James A. Dudek
*Attorney, Agent, or Firm*—Flehr, Hohbach, Test, Albritton & Herbert; Kevin J. Zimmer

[57] ABSTRACT

A dual-mode successive detection amplifier for providing a first output signal corresponding to a logarithmic function of a RF input signal, and for providing a second limited RF output signal is disclosed herein. A RF input signal is applied to the first of a succession of amplification stages arranged along a RF signal path to cascade amplify the RF input signal into the limited RF output signal. A plurality of detector/limiter (D/L) circuits interposed between the amplification stages limit RF signal energy propagating along the RF signal path so as to prevent saturation of the amplification stages. The D/L modules also provide a succession of detection signals corresponding to video envelopes of the RF signal energy produced by each of the amplification stages. The detection signals are applied to a video summation line and therein summed to produce the logarithmic output signal.

18 Claims, 7 Drawing Sheets

DUAL-MODE LOGARITHMIC AMPLIFIER HAVING CASCADED STAGES

The present invention relates generally to logarithmic amplifiers, and, more particularly, to high-speed successive detection logarithmic amplifiers.

BACKGROUND OF THE INVENTION

Logarithmic amplifiers are used in many applications where signals of large dynamic range may be encountered. A logarithmic amplifier effectively compresses the dynamic range of the input signals, producing output signals whose magnitudes are logarithmically related to the magnitudes of the input signals. The compressed output signals may then be applied to signal processing circuitry having a dynamic range less than that associated with the input signals.

One technique used to produce a logarithmic output signal is known as successive detection. In this approach a series of cascaded amplifiers are connected such that an input signal applied to a first amplifier is amplified and applied to a second amplifier in the series. The second amplifier amplifies the signal and applies it to a third amplifier in the series, and so on. The output of each amplifier is also directed to a corresponding detector through, for example, an RF coupler or power splitter. When the RF signal energy produced by a particular amplifier exceeds a detector threshold, the detector coupled to the amplifier produces a detection signal corresponding to the video envelope of the detected RF energy. As the magnitude of the input signal is increased, the cascaded amplifiers successively saturate. Specifically, the final amplifier in the cascade saturates first, followed by the next to last amplifier, and so on. Since when an amplifier saturates it is producing a maximum RF output, the magnitude of the detection signal produced by the associated detector is also at a maximum.

The detectors are designed so that when an amplifier produces RF signal energy that saturates the succeeding amplifier, the signal energy also exceeds the corresponding detector threshold. Hence, for a given input signal the detectors associated with each saturated stage are producing maximum detection signals, while the amplifier preceding the sequence of saturated stages is operative in the linear regime. The composite video output signal corresponding to this input signal is then formed by summing the detection signals produced by each stage. The composite video output signal provides a piecewise linear approximation to an ideal logarithmic response to the input signal, wherein the accuracy of the piecewise approximation is inversely proportional to the gain of the RF amplifier stages.

As is indicated above, for input signals within the input dynamic range of a successive detection logarithmic amplifier a number of the constituent RF amplifiers will be operative in a saturation mode. When the magnitude of the applied input suddenly decreases (e.g., at the conclusion of a high energy pulse), there ensues a recovery period during which the transistors and associated bias circuitry within the saturated amplifier stages transition from saturation to small signal operation. During this recovery period the amplifier exhibits decreased ability to accurately respond to low level pulses arriving shortly after the high level signal responsible for inducing saturation.

Conventional implementations of the detectors associated with the cascaded RF amplifiers also tend to compromise response capability. For example, at microwave frequencies the response time, i.e., recovery time, of the logarithmic amplifier to step decreases in RF input signal intensity is degraded by the slow turn-off of biased Schottky detector circuits. As a consequence, RF couplers in conjunction with tunnel diodes operative at lower RF input levels have been utilized for RF detection. Unfortunately, realization of detectors involving this combination of elements tends to be relatively expensive, and is often impractical in many applications given the large size of RF couplers.

It is also possible to tap the output of the final RF amplifier within the cascade so as to obtain a nearly constant-power RF output, generally referred to as an RF "limited" output. The RF-limited outputs of conventional successive-detection logarithmic amplifiers have tended to be of relatively poor quality, typically exhibiting high levels of undesired harmonics and a considerable dependence in phase on the magnitude of the RF input. In contrast, an ideal limited RF output would be of a fixed magnitude for input levels above a specific threshold. Moreover, such an ideal RF output would be of a phase, although delayed in time, substantially identical to the input signal without being dependent upon the magnitude thereof. Finally, it is desired that RF limited outputs be relatively free of even harmonics so as to improve signal to noise ratio.

OBJECTS OF THE INVENTION

It is an object of the present invention to provide a multi-stage logarithmic amplifier capable of fast recovery from high level signals and rapid response to pulsed input signals.

It is a further object of the present invention to provide a dual-mode logarithmic amplifier having an RF limited output which lacks undesired harmonic components and which exhibits improved phase-tracking of the applied input signal, particularly within the microwave frequency range.

SUMMARY OF THE INVENTION

In summary, the present invention is a dual-mode successive detection amplifier for providing a first output signal corresponding to a logarithmic function of an RF input signal, and for providing a second limited RF output signal. An RF input signal is applied to the first of a succession of amplification stages arranged along a RF signal path to cascade amplify the RF input signal into the limited RF output signal. A plurality of detector/limiter (D/L) modules interposed between the amplification stages limit RF signal energy propagating along the RF signal path so as to prevent saturation of the amplification stages. The D/L modules also provide a succession of detection signals corresponding to video envelopes of the RF signal energy produced by each of the amplification stages. The detection signals are applied to a video summation line and therein summed to produce the logarithmic output signal.

BRIEF DESCRIPTION OF THE DRAWINGS

Additional objects and features of the invention will be more readily apparent from the following detailed description and appended claims when taken in conjunction with the drawings, in which:

DESCRIPTION OF THE PREFERRED EMBODIMENT

Figure 1:
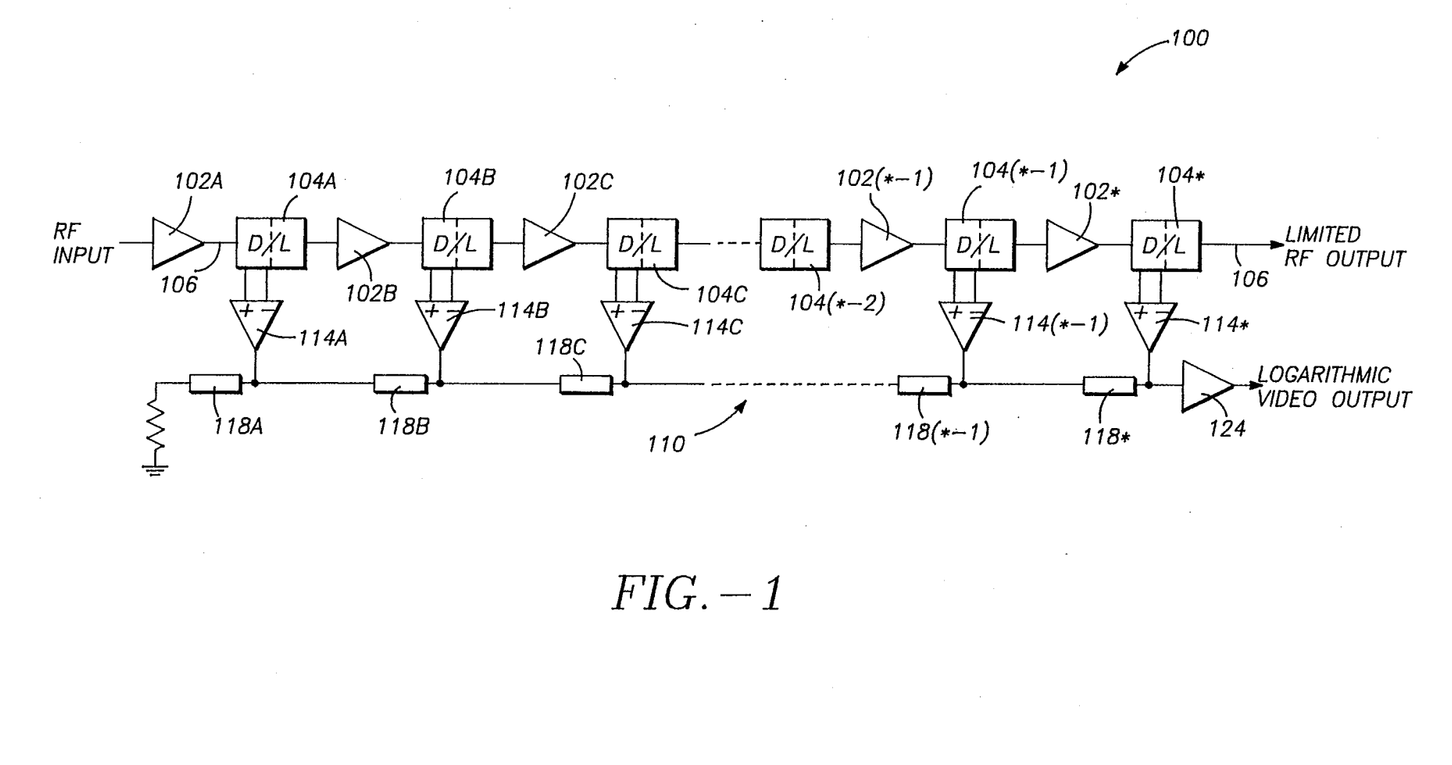
FIG. 1 illustrates a preferred embodiment of a dual-mode, successive detection logarithmic amplifier disposed to provide both Limited RF Output and Logarithmic Video Output signals in accordance with the present invention.

FIG. 1 illustrates a preferred embodiment of a dual-mode, successive detection logarithmic amplifier 100 disposed to provide a high-frequency Limited RF Output signal and a Logarithmic Video Output signal. The inventive logarithmic amplifier 100 includes a plurality of cascaded linear RF amplifier stages 102A-102*, between which are interposed a plurality of detector/limiter (D/L) circuits 104A-104* along RF signal path 106. A high frequency (e.g., microwave) electromagnetic signal, hereinafter referred to as an RF input signal, is applied to the first RF amplifier stage 102A. The RF Input signal is amplified by the first stage 102A and received by the first D/L circuit 104A. As is described hereinafter, the D/L circuits 104A-104* perform a "hard limiting" operation which symmetrically clips RF signals exceeding a predefined magnitude threshold so as to prevent saturation of the succeeding amplifier stages 102. The RF output of the first D/L circuit 104A is applied to the second amplifier stage 102B, with subsequent amplification and limiting being provided by the amplifier stages 102C-102* and D/L circuits 104C-104*. The RF signal energy passed by the last D/L circuit 104* corresponds to a Limited RF Output signal produced by the logarithmic amplifier 100.

As was discussed in the Background of the Invention, in conventional logarithmic amplifiers cascade amplification of the input signal by successive amplification stages initially results in saturation of the last stage. Thereafter, as the magnitude of the input signal is increased the next to last stage becomes saturated, and so on. Hence, the maximum signal generated by the detector associated with each stage is proportional to the saturation-level output of the associated amplifier.

In contrast, the D/L circuits 104 within the logarithmic amplifier of the present invention prevent the amplification stages 102 from becoming saturated by limiting the RF input to each. This results in the amplifier stages 102 being kept in a linear regime of operation such that the maximum limited RF output of each stage is just below the saturation-level output. Accordingly, cascade amplification of the RF input signal by successive amplification stages 102 initially results in the last stage 102* producing a maximum RF output signal just below the saturation-level output. As is discussed below, the turn-on threshold of a rectifying detector arrangement included within the next to last D/L network 104(*−1) is selected such that the network 104(*−1) begins to generate a differential detection signal just as the output of the last amplifier stage 102* begins to be limited by the D/L network 104(*−1). In this way further increases in the level of the RF Input signal cause the detectors within a D/L network 104(*−2) to turn-on just as the RF output of amplifier 102(*−1) reaches its maximum limited value.

Each of the D/L networks 104A-104* are connected to various locations on a video summation line 110 by corresponding differential video amplifiers 114A-114*. Each video amplifier 114 serves to amplify, and to couple, the differential video signal produced by one of the D/L networks 104 to the video summation line 110. Each video amplifier 114 may be implemented using, for example, an operational amplifier such as the CLC404 AMC Monolithic Op Amp produced by Comlinear Corporation of Fort Collins, Colo.

The summation line 110 includes a plurality of delay elements 118A-118* each designed to approximate the RF signal delay (e.g. 350 picoseconds) through a corresponding amplification stage 102 and associated D/L network 104. In a preferred embodiment the summation line 110 is implemented using segments of microstrip transmission line having identical characteristic impedances $Z_o$ (e.g., 50 ohms), and is matched to a termination resistance of characteristic impedance $Z_o$. The individual transmission line segments are linked by the delay elements 118, each of which may be realized as a video lowpass filter comprised of discrete inductive and capacitive circuit components. At microwave frequencies these circuit components will generally be implemented as microstrip spiral inductors and chip capacitors.

Referring to FIG. 1, the video amplifier 114* is the first of the video amplifiers 114 to begin to contribute a video output voltage to the summation line 110, and does so when the detector within the D/L network 104* becomes conductive. The video output voltage provided by the amplifier 114* is proportional to the log of the RF input signal over a first range (e.g., 10 dB) of the dynamic range of the RF input signal. An increase in the level of the RF input signal above this first 10 dB range results in the output level of the amplification stage 102* reaching its maximum limited level. Again, at this same time the D/L network 104(*−1) will begin to drive the video amplifier 114(*−1) so as to supply a video output voltage to the summation line 110 for the next 10 dB of RF input signal dynamic range.

The output provided by the amplifier 114(*−1) will be substantially the same as that generated by the amplifier 114* over the first 10 dB of input dynamic range. This process continues until the RF input signal level reaches the final 10 dB of input dynamic range, at which time the first video amplifier 114A begins to contribute to the voltage on the summation line 110. The video output of the delay line 110 corresponds to the arithmetic sum of the outputs from the video amplifiers 114, and is used to drive an output video amplifier 124. This results in the Logarithmic Video Output proportional to the logarithm of the RF input signal being produced by the video amplifier 124 (see, e.g., R. S. Hughes, *Logarithmic Amplification;* Artech House, Inc., of Dedham, Mass., 1968; pp. 15-19).

As is indicated by the foregoing, for a given RF input signal level a set of the amplifier stages 102 extending from the end of the RF path 106 will be operating in a linear region just below the level of saturation. The preceding series of amplifier stages 102 will be producing RF signal outputs of various levels below the saturation level. As a consequence, the logarithmic amplifier 100 is disposed to accurately respond to sudden decreases in the level of the RF input signal since each of the amplification stages 102 are in a linear region of operation, i.e., none of the stages 102 are in saturation. It follows that a sudden reduction in the level of the RF input signal results in a nearly instantaneous corresponding linear reduction in the output level of the amplifier stage last reaching its maximum limited RF output level.

Figure 2:
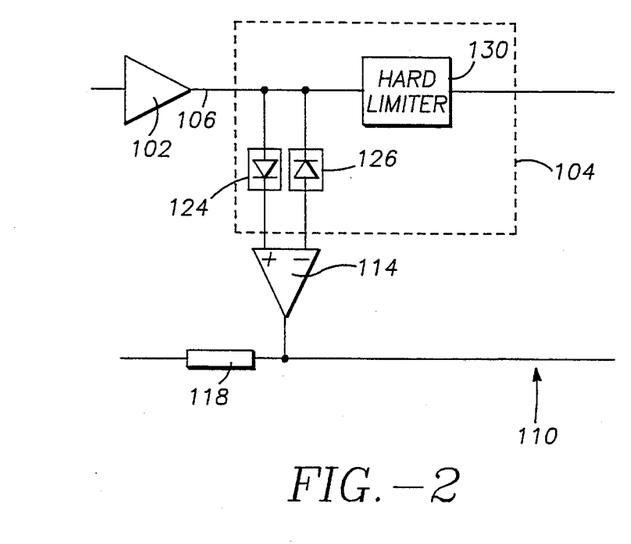
FIG. 2 shows a block diagrammatic representation of a preferred implementation of one of the detector/limiter (D/L) circuits included between the amplification stages of the inventive logarithmic amplifier.

FIG. 2 shows a block diagrammatic representation of a preferred implementation of one of the D/L circuits 104. As shown in FIG. 2, the D/L circuit 104 includes a pair of oppositely directed half-wave rectifiers 124 and 126 connected between the RF signal path 106 and the input terminals of the video amplifier 114. The half-wave rectifiers 124 and 126 become conductive so as to provide video signals of opposite polarity to the amplifier 114 when RF signal energy produced by the amplification stage 102 exceeds a detection threshold. This detection threshold is selected such that the rectifiers 124 and 126 turn on just as an RF hard limiter 130 begins to symmetrically clip, i.e., limit, RF signal energy propagating along the RF signal path 106. Again, the RF hard limiter 130 is designed to begin limiting RF energy incident thereon just before the succeeding amplification stage (not shown) becomes saturated. The dual-detection implementation of FIG. 2 significantly improves isolation between the video summation line 110 and the RF signal path 106 relative to existing detection networks. Specifically, there exists an increased possibility of undesired feedthrough of RF signal energy into the video output signal when a conventional single-ended detection signal is directly coupled to the summation line 110. The improved isolation afforded by the implementation of FIG. 2 enables the inventive logarithmic amplifier 100 to exhibit improved gain and dynamic range.

The preferred implementation of the D/L circuit 104 shown in FIG. 2 may be realized using conventional Schottky diodes so as to have a power-handling capability on the order of +15 to +20 dBm. In addition, each D/L circuit 104 will typically be designed to limit the power of the RF signal supplied to the succeeding amplification stage to approximately +3 dBm. It is anticipated that the D/L circuits 104 will exhibit insertion loss of approximately 2.7 to 4.5 dB over the frequency range extending from 2 to 20 GHz. In the preferred implementation of FIG. 2 each D/L circuit 104 provides a video detection signal of approximately 6 millivolts in response to RF signal energy of +6 dBm, and a signal of 400 millivolts at RF input levels of +16 dBm.

Figure 3:
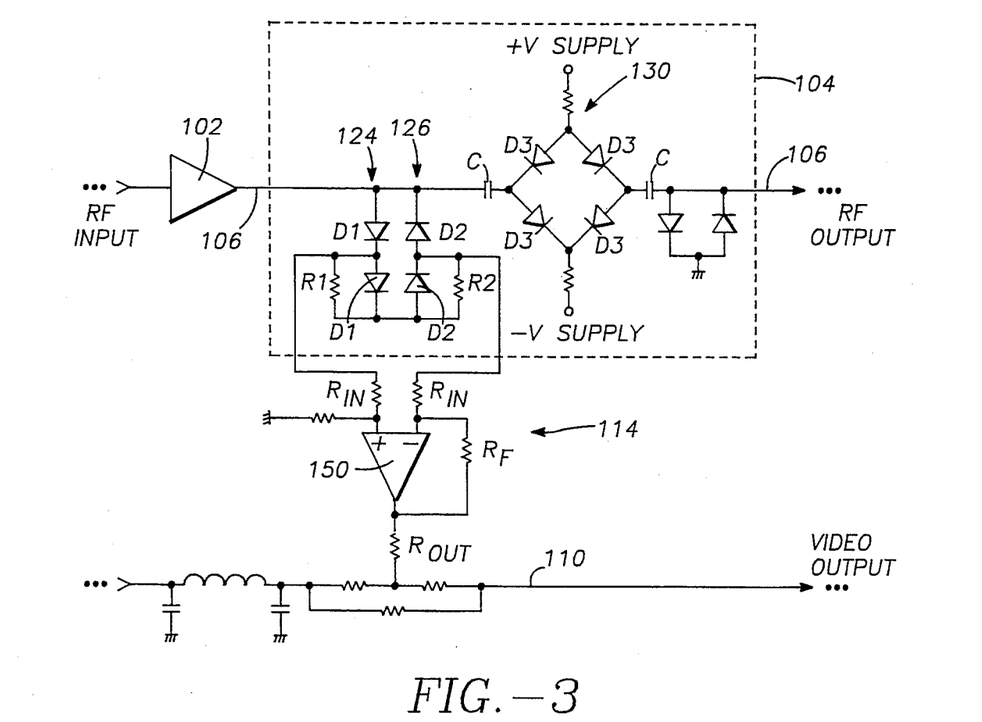
FIG. 3 shows a schematic representation of a preferred implementation of a D/L circuit suitable for realization as a monolithic microwave integrated circuit (MMIC).

FIG. 3 shows a schematic representation of a preferred implementation of a D/L circuit 104 suitable for realization as a monolithic microwave integrated circuit (MMIC) in a medium such as, for example, gallium arsenide (GaAs). Referring to FIG. 3, the oppositely-directed half-wave rectifiers 124 and 126 include pairs of series-connected Schottky diodes D1 and D2, respectively. A grounded resistor R1 is connected in parallel with one of the diodes D1, and a grounded resistor R2 is connected in parallel with one of the diodes D2. The hard limiter 130 includes a diode bridge comprising a set of four Schottky diodes D3 biased by $+V$ and $-V$ voltage supplies. The RF signal path 106 may be isolated from the DC bias current induced by the $+V$ and $-V$ voltage supplies by isolation capacitors C. Omission of the isolation capacitors will generally necessitate utilization of equal and opposite supply voltages such that a virtual DC ground is maintained on the RF path 106. A pair of anti-parallel Schottky diodes D3 at the output of the limiter 130 reduce feedthrough of RF signal energy associated with RF input signals of relatively large magnitude.

Again referring to FIG. 3, the video amplifier 114 includes an operational amplifier 150 having a feedback resistor Rf connected between the inverting input terminal and output terminal thereof. The operational amplifier 150 is resistively coupled to the half-wave rectifiers 124 and 126 through input resistors Rin, and is operative to drive the summation line 110 through an output resistor Rout.

Figure 4:
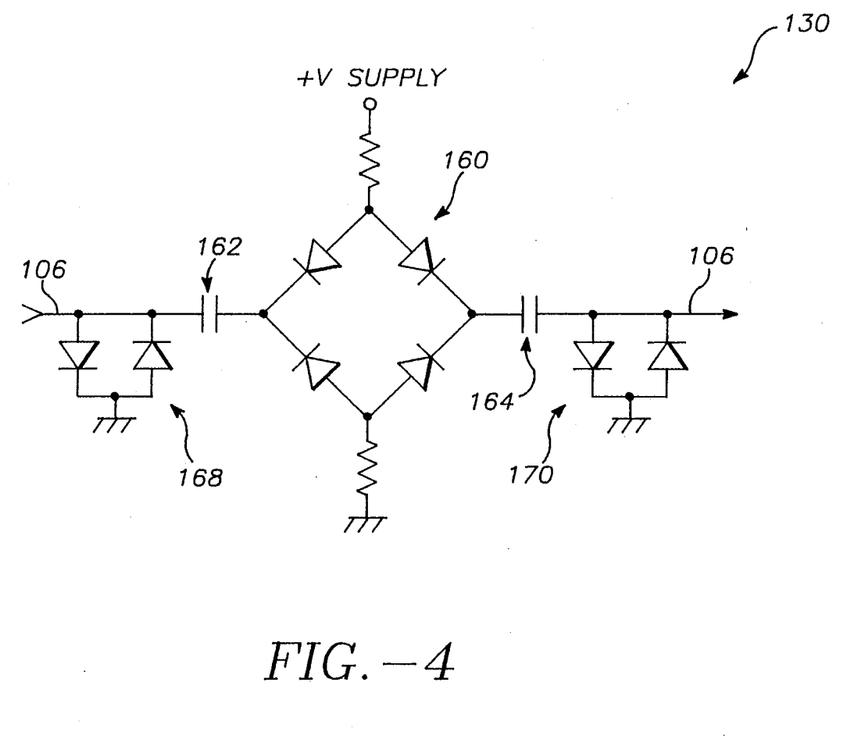
FIG. 4 depicts an implementation of an RF hard limiter suitable for fabrication as an MMIC using integrated Schottky diodes.

FIG. 4 depicts an alternative implementation of the hard limiter 130 also suitable for realization as an MMIC using integrated Schottky diodes. Referring to FIG. 4, a diode bridge 160 initiates limiting of RF signal energy in excess of a threshold determined by the magnitude of the DC bias ($+V$). The DC bias current is isolated from the RF signal path 106 by DC isolation capacitors 162 and 164. Antiparallel input diodes 168 provide additional attenuation at higher input levels, while antiparallel output diodes 170 reduce feedthrough of RF signal energy associated with high-power input signals.

The Schottky diodes included within the preferred implementations of the hard limiter 130 operate to clip RF signals in excess of a predefined turn-on threshold on a cycle-by-cycle basis. As a consequence of the symmetrical configuration of the hard limiter 130 disclosed herein, equal and opposite RF-limited wave shapes are produced for positive and negative cycles of RF signal energy. Hence, undesired even harmonics are suppressed as RF signal energy propagating along the RF signal path 106 passes through successive D/L circuits 104. Since integrated Schottky diodes may be realized which turn on and off during each RF cycle, the hard limiter 130 does not degrade the response or recovery time of the logarithmic amplifier 100. Moreover, the nonlinear limiting characteristics of the implementations of the hard limiter 130 and half-wave rectifiers 124 and 126 disclosed herein enable the RF amplification stages 102 and video amplifiers 114 to be maintained in linear regimes of operation. In this way limitations on recovery time resulting from amplifier saturation may be avoided.

Figure 5:
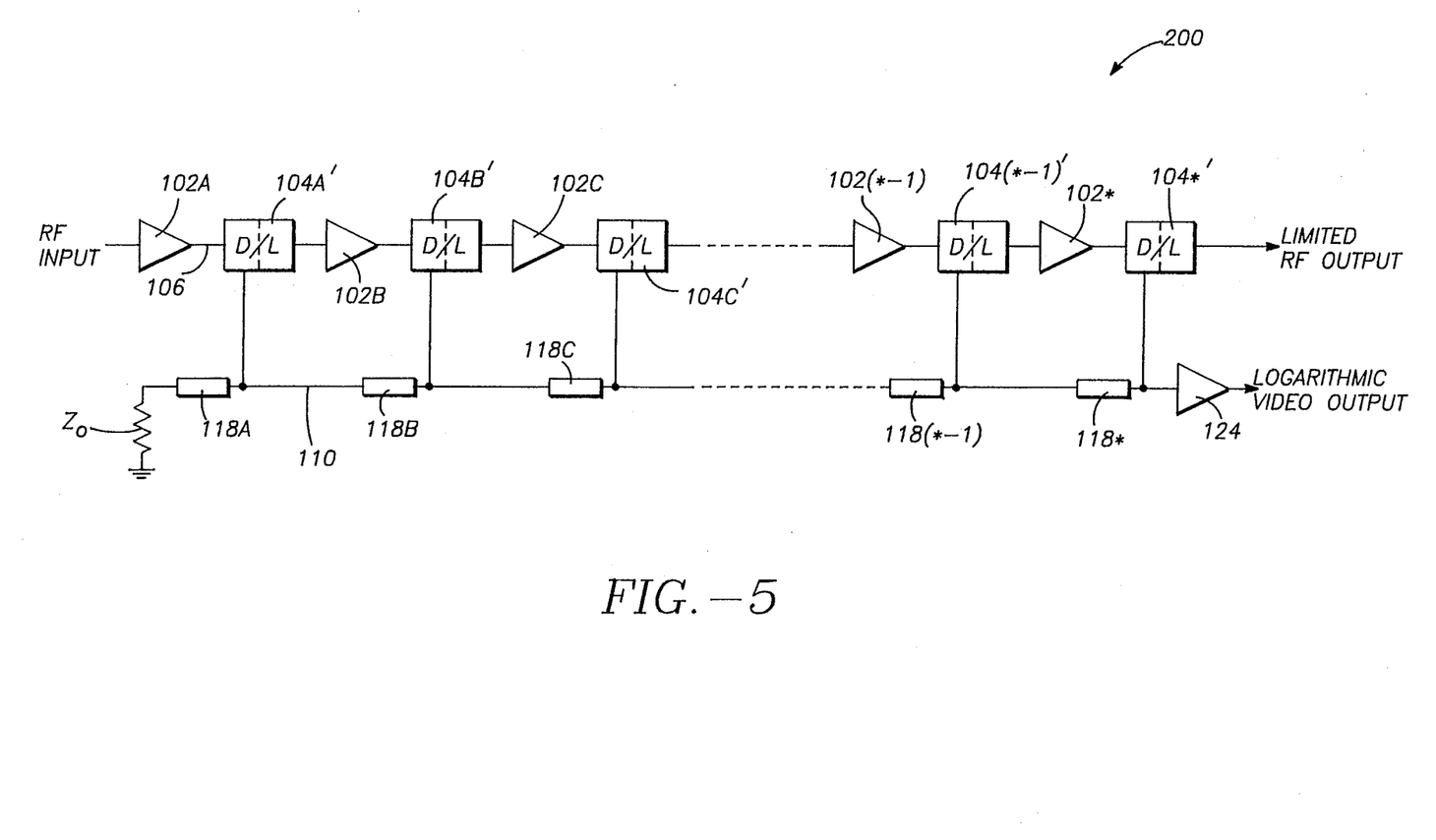
FIG. 5 depicts a first alternately preferred embodiment of a multi-stage, successive detection logarithmic amplifier of the present invention.
Figure 6:
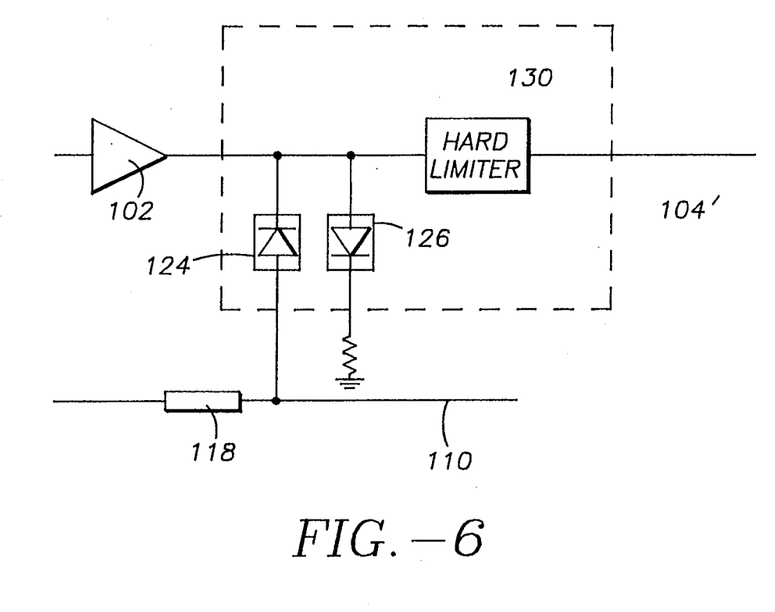
FIG. 6 shows an implementation of a D/L circuit utilized within the embodiment of FIG. 5 to couple a video detection signal directly to the video summation line.

FIG. 5 depicts a first alternate embodiment of a multistage, successive detection logarithmic amplifier 200 of the present invention. The logarithmic amplifier 200 is substantially similar to the logarithmic amplifier 100 in that it includes a plurality of cascaded linear RF amplifier stages 102A-102*. Between the amplifier stages 102A-102* are interposed a plurality of detector/limiter (D/L) circuits 104A′–104*′, each having a single output directly connected to the video summation line 110. Hence, the logarithmic amplifier 200 differs from the amplifier 100 in that the former does not include a set of differential video amplifiers coupled to the summation line. As may be seen by reference to the representation of the D/L circuits 104A′–104*′ shown in FIG. 6, only the first half-wave rectifier 124 is utilized in providing a video detection signal to the summation line 110.

Figure 7:
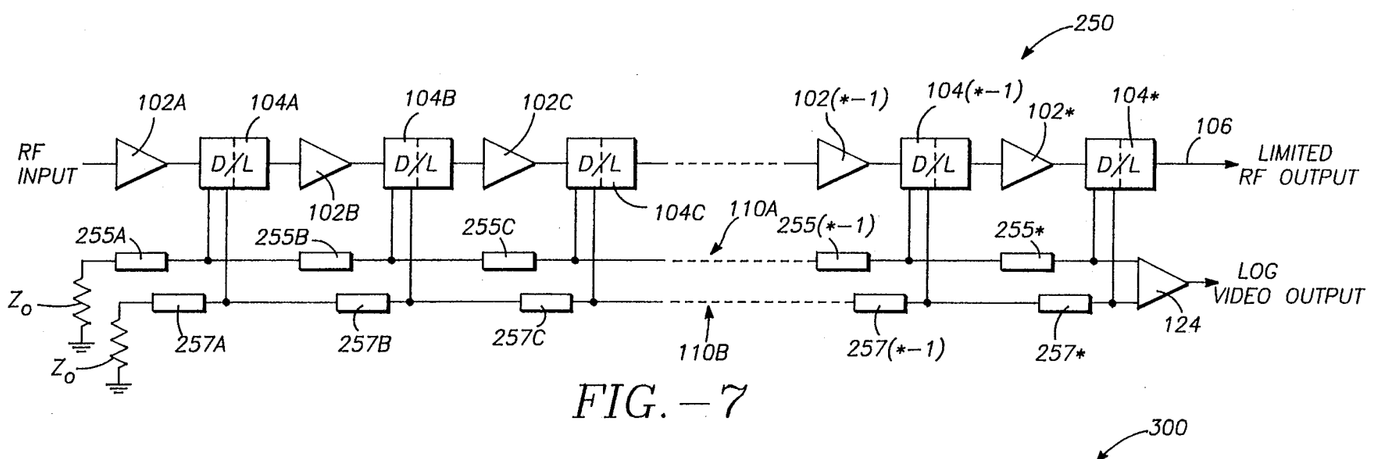
FIG. 7 depicts a second alternately preferred embodiment of a multi-stage, successive detection logarithmic amplifier of the present invention.

FIG. 7 depicts a second alternate embodiment of a multi-stage, successive detection logarithmic amplifier 250 of the present invention. Referring to FIG. 7, the D/L circuits 104A–104* included within the amplifier 250 are identical to those included within the logarithmic amplifier 100. Within the amplifier 250 the D/L circuits 104 are connected to first and second parallel summation lines 110A and 110B, having respective delay elements 255A–255* and 257A–257*, rather than to a set of differential video amplifiers. Instead, a single differential video amplifier 260 is used in lieu of connecting a separate differential video amplifier to each D/L circuit 104. The differential video amplifier 260 is operative to supply the logarithmic video output produced by the logarithmic amplifier 250.

Figure 8:
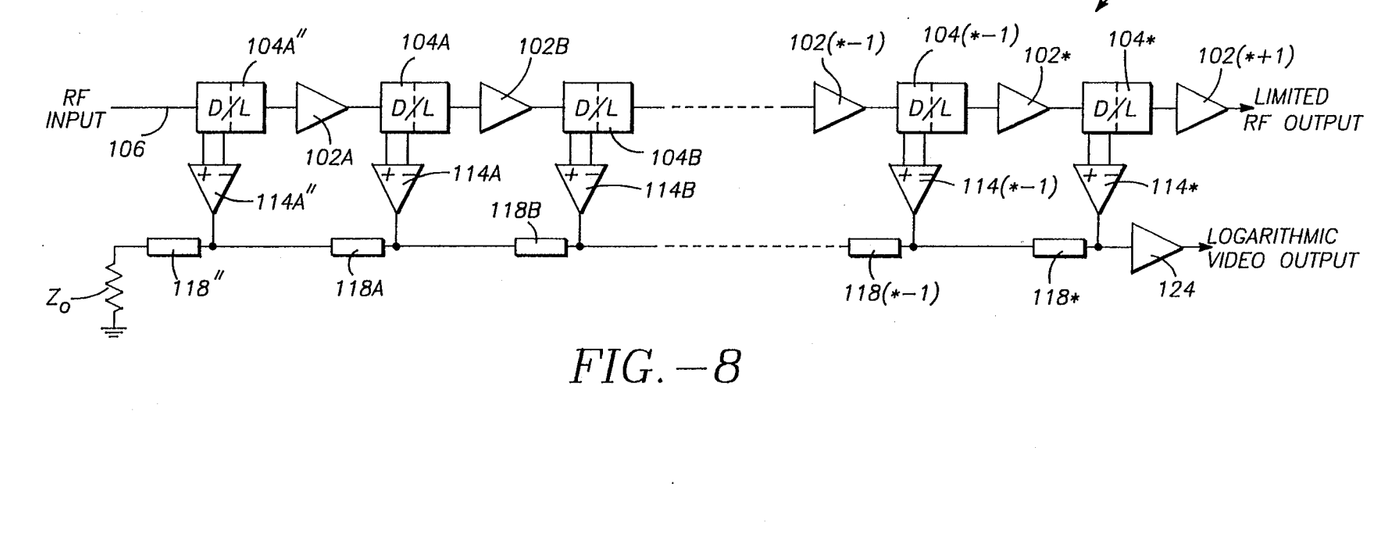
FIG. 8 shows a third alternately preferred embodiment of the inventive logarithmic amplifier which includes an additional limiting stage interposed between the RF input signal and the first amplification stage.

FIG. 8 shows a third alternate embodiment of a logarithmic amplifier 300 of the present invention. The amplifier 300 is substantially similar to the logarithmic amplifier 100 (FIG. 1), but further includes an additional limiting stage interposed between the RF input signal and the first amplification stage 102A. In particular, the RF input signal impinges upon an input D/L network 104″ in cascade connection with the first amplification stage 102A. The differential detection signal produced by the input D/L network 104″ is applied to input differential amplifier 114″, which drives the summation line 110. The additional signal attenuation provided by the input D/L network 104″ results in the logarithmic amplifier 300 being well-suited for operation in the presence of high-power RF input signals. An output RF amplification stage 102(*+1) may be included if it is desired to increase the magnitude of the limited RF output signal.

Figure 9:
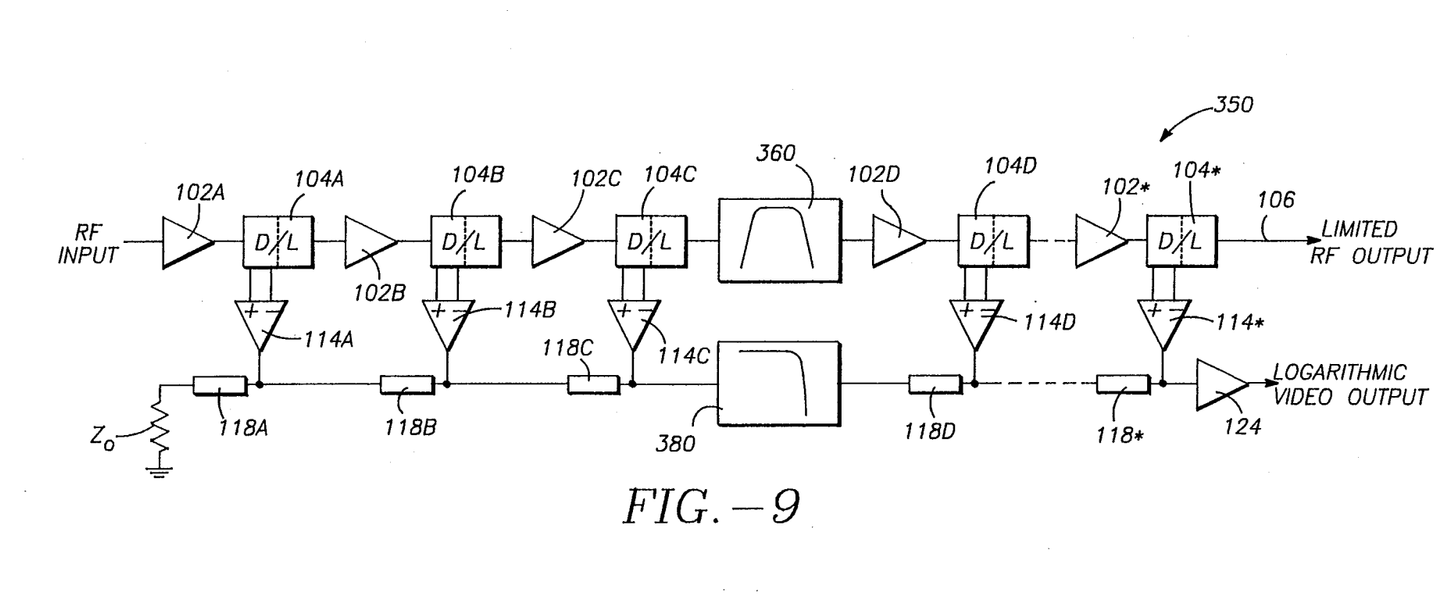
FIG. 9 depicts a fourth alternately preferred embodiment of the logarithmic amplifier of the present invention which includes a noise-limiting bandpass filter.

FIG. 9 shows a fourth alternate embodiment of a logarithmic amplifier 350 of the present invention. The amplifier 350 is also substantially similar to the logarithmic amplifier 100 (FIG. 1), but further includes a noise-limiting bandpass filter 360 interposed between a pair of amplification stages 102 preferably separated by at least two stages from the amplifier 102*. The amplifier 350 is particularly well-suited for applications in which maximum dynamic range is desired and a restricted RF bandwidth is acceptable. The filter 360 serves to reduce the RF noise power incident on the amplification stages 102 following the filter 360 along the RF signal path 106. A video lowpass filter 380 having a time delay substantially equivalent to the time delay through the filter 360 is included between corresponding delay elements 118 of the video summation line 110. In this manner the contributions from each of the differential video amplifiers 114 corresponding to a particular portion of the RF input signal are made to arrive contemporaneously at the output video amplifier 124, thereby reducing rise and recovery times. The video lowpass filter 380 will typically be realized using the same type of elements used to implement the delay elements 118, i.e., microstrip spiral inductors and chip capacitors.

While the present invention has been described with reference to a few specific embodiments, the description is illustrative of the invention and is not to be construed as limiting the invention. Various modifications may occur to those skilled in the art without departing from the true spirit and scope of the invention as defined by the appended claims.

What is claimed is:

1. A successive detection amplifier for providing an output signal corresponding to a logarithmic function of a RF input signal, comprising:
    cascaded amplification stages for amplifying said RF input signal along a RF signal path, said RF input signal being coupled to an input one of said stages;
    limiter means interposed between selected ones of said amplification stages for limiting RF signal energy propagating along said RF signal path so as to prevent saturation of succeeding ones of said amplification stages;
    detector means for providing a succession of detection signals corresponding to video envelopes of RF output signals produced by each of said amplification stages, said detector means including a plurality of differential detectors each of which is connected to an output of one of said amplification stages; and
    summing means for summing said succession of detection signals in order to generate said output signal corresponding to said logarithmic function of said RF input signal.

2. The amplifier of claim 1 wherein said summing means includes a summation line to which are provided said detection signals at successive points along said summation line wherein signal delays through said summation line between successive ones of said points approximate signal delays through corresponding successive ones of said amplification stages.

3. The amplifier of claim 2 wherein said limiting means includes a succession of limiter circuits disposed between each of said amplification stages for preventing saturation of said amplification stages;
    whereby a limited RF signal is generated by an output one of said amplification stages.

4. The amplifier of claim 2 wherein said limiting means includes an input limiter circuit connected to said input one of said amplification stages and said detector means includes an input detector connected to said summation line, said input signal being applied to said input limiter circuit and to said input detector.

5. The amplifier of claim 1 further including a bandpass filter interposed between successive ones of said amplification stages.

6. The amplifier of claim 5 wherein said summing means includes a summation line, said summation line including a delay element having a delay substantially equivalent to delay through said bandpass filter at a center frequency of said RF input.

7. The amplifier of claim 1 wherein each of said differential detectors includes a pair of oppositely directed half-wave rectifiers.

8. A successive detection amplifier for providing an output signal corresponding to a logarithmic function of a RF input signal, comprising:
    cascaded amplification stages for amplifying said RF input signal along a RF signal path, said RF input signal being coupled to an input one of said stages:
    limiter means interposed between selected ones of said amplification stages for limiting RF signal energy propagating along said RF signal path so as to prevent saturation of succeeding ones of said amplification stages:

detector means for providing a succession of detection signals corresponding to video envelopes Of RF output signals produced by each of said amplification stages, said detector means including a plurality of half-wave rectification detection circuits for detecting said video envelopes of said RF output signals produced by each of said amplification stages, and a plurality of differential video amplifiers, each of said amplifiers being connected to one of said detection circuits; and summing means for summing said succession of detection signals in order to generate said output signal corresponding to said logarithmic function of said RF input signal.

9. A successive detection amplifier for providing an output signal corresponding to a logarithmic function of a RF input signal, comprising:

cascaded amplification stages for amplifying said RF input signal along a RF signal path. said RF input signal being coupled to an input one of said stages;

limiter means interposed between selected ones of said amplification stages for limiting RF signal energy propagating along said RF signal path so as to prevent saturation of succeeding ones of said amplification stages:

detector means for providing a succession of detection signals corresponding to video envelopes of RF output signals produced by each of said amplification stages; and summing means for summing said succession of detection signals in order to generate said output signal corresponding to said logarithmic function of said RF input signal wherein said means for summing includes first and second video summation lines connected to a differential video amplifier, and wherein said detector means includes a plurality of half-wave rectification circuits each having first and second half-wave rectifiers respectively connected between said first and second summation lines and an output of a corresponding one of said amplification stages.

10. A dual-mode successive detection amplifier for providing a first output signal corresponding to a logarithmic function of a RF input signal and a second limited RF output signal, comprising:

cascaded amplification stages for amplifying said RF input signal along a RF signal path, said RF input signal being coupled to an input one of said stages;

limiter means interposed between selected ones of said amplification stages for limiting RF signal energy propagating along said RF signal path so as to prevent saturation of succeeding ones of said amplification stages, said limited RF output signal being coupled from an output one of said amplification stages;

detector means for providing a succession of detection signals corresponding to video envelopes of RF output signals produced by each of said amplification stages, said detector means including a plurality of differential amplification circuits for producing said succession of detection signals; and summing means for summing said succession of detection signals in order to generate said first output signal.

11. The amplifier of claim 10 wherein said summing means includes a summation line to which are provided said detection signals at successive points along said summation line wherein signal delays through said summation line between successive ones of said points approximate signal delays through corresponding successive ones of said amplification stages.

12. The amplifier of claim 11 further including a like plurality of differential detectors, each of said differential detectors being connected between a corresponding one of said differential amplification circuits and an output of one of said cascaded amplification stages.

13. The amplifier of claim 11 wherein said limiting means includes a succession of limiter circuits disposed between each of said amplification stages, each of said limiter circuits being operative to limit output provided by one of said amplification stages so as to prevent saturation of a succeeding one of said stages.

14. The amplifier of claim 11 wherein said limiting means includes an input limiter circuit connected to said input one of said amplification stages and said detector means includes an input detector connected to said summation line, said input signal being applied to said input limiter circuit and to said input detector.

15. The amplifier of claim 11 in which a bandpass filter is interposed between successive ones of said amplification stages and in which said summation line further includes a delay element having a delay substantially equivalent to delay through said bandpass filter at a center frequency of said RF input.

16. A dual-mode successive detection amplifier for providing a first output signal corresponding to a logarithmic function of a RF input signal and a second limited RF output signal, comprising:

cascaded amplification stages for amplifying said RF input signal along a RF signal path said RF input signal being coupled to an input one of said stages:

limiter means interposed between selected ones of said amplification stages for limiting RF signal energy propagating along said RF signal path so as to prevent saturation of succeeding ones of said amplification stages, said limited RF output signal being coupled from an output one of said amplification stages:

detector means for providing a succession of detection signals corresponding to video envelopes of RF output signals produced by each of said amplification stages, said detector means including a plurality of half-wave rectification detection circuits for detecting said video envelopes of said RF output signals produced by each of said amplification stages, and a plurality of differential video amplifiers; and a summation line for summing said succession of detection signals in order to generate said first output signal, each of said differential video amplifiers being connected between one of said detection circuits and said summation line.

17. A dual-mode successive detection amplifier for providing a first output signal corresponding to a logarithmic function of a RF input signal and a second limited RF output signal, comprising:

cascaded amplification stages for amplifying said RF input signal along a RF signal path said RF input signal being coupled to an input one of said stages:

limiter means interposed between selected ones of said amplification stages for limiting RF signal energy propagating along said RF signal path so as to prevent saturation of succeeding ones of said amplification stages, said limited RF output signal being coupled from an output one of said amplification stages:

detector means for providing a succession of detection signals corresponding to video envelopes of RF output signals produced by each of said amplification stages:

summing means for summing said succession of detection signals in order to generate said first output signal wherein said means for summing includes first and second video summation lines connected to a differential video amplifier, and wherein said detector means includes a succession of half-wave rectification circuits each of which are connected to an output of a corresponding one of said amplification stages and to said first and second video summation lines.

18. A successive detection amplifier for providing an output signal corresponding to a logarithmic function of a RF input signal, comprising:

cascaded amplification stages for amplifying said RF input signal along a RF signal path, said RF input signal being coupled to an input one of said stages;

limiter means interposed between selected ones of said amplification stages for limiting RF signal energy propagating along said RF signal path so as to prevent saturation of succeeding ones of said amplification stages;

a plurality of differential detectors, each of said plurality of differential detectors being connected to an output of one of said amplification stages;

a like plurality of differential amplifiers driven by corresponding ones of said plurality of differential detectors, said like plurality of differential amplifiers producing a succession of detection signals; and a summation line for summing said succession of detection signals in order to generate said output signal corresponding to said logarithmic function of said RF input signal.

* * * * *